United States Patent
Wu et al.

(10) Patent No.: US 9,234,917 B2
(45) Date of Patent: Jan. 12, 2016

(54) PROBING DEVICE AND MANUFACTURING METHOD THEREOF

(75) Inventors: Chien-Chou Wu, Hsinchu Hsiang (TW); Ming-Chi Chen, Hsinchu Hsiang (TW); Chung-Che Li, Hsinchu Hsiang (TW)

(73) Assignee: MPI CORPORATION, Chu-Pei (TW)

( * ) Notice: Subject to any disclaimer, the term of this patent is extended or adjusted under 35 U.S.C. 154(b) by 358 days.

(21) Appl. No.: 13/612,849

(22) Filed: Sep. 13, 2012

(65) Prior Publication Data

US 2013/0069686 A1 Mar. 21, 2013

(30) Foreign Application Priority Data

Sep. 16, 2011 (TW) .............................. 100133504 A

(51) Int. Cl.
  *G01R 31/00* (2006.01)
  *G01R 3/00* (2006.01)
  *H01F 38/20* (2006.01)
  *H01F 41/00* (2006.01)
  *H05K 3/24* (2006.01)
  *H05K 3/32* (2006.01)
  *G01R 1/073* (2006.01)

(52) U.S. Cl.
  CPC *G01R 3/00* (2013.01); *H01F 38/20* (2013.01); *H01F 41/00* (2013.01); *H05K 3/241* (2013.01); *H05K 3/32* (2013.01); *G01R 1/07378* (2013.01); *Y10T 29/4902* (2015.01); *Y10T 29/49124* (2015.01)

(58) Field of Classification Search
  CPC ..... H05K 3/241; H05K 3/32; G01R 1/07371; G01R 1/07378

USPC ............ 324/754.01, 754.03–754.13, 755.01, 324/755.03–755.09, 756.03
See application file for complete search history.

(56) References Cited

U.S. PATENT DOCUMENTS

| | | | | |
|---|---|---|---|---|
| 8,049,525 B2* | 11/2011 | Yamada et al. | ......... | 324/754.11 |
| 8,253,429 B2* | 8/2012 | Lee et al. | ................. | 324/754.07 |
| 2006/0040417 A1* | 2/2006 | Eldridge et al. | ................ | 438/14 |
| 2006/0255814 A1* | 11/2006 | Eldridge et al. | ............. | 324/754 |
| 2008/0309362 A1* | 12/2008 | Jeon et al. | ...................... | 324/762 |

(Continued)

FOREIGN PATENT DOCUMENTS

| | | | |
|---|---|---|---|
| CN | 101046482 A | 10/2007 | |
| CN | 101644724 A | 2/2010 | |
| JP | 2010-266300 A | 11/2010 | |
| KR | 10-2010-0046976 A | 5/2010 | |

(Continued)

*Primary Examiner* — Patrick Assouad
*Assistant Examiner* — Demetrius Pretlow
(74) *Attorney, Agent, or Firm* — Ding Yu Tan

(57) ABSTRACT

A probing device and manufacturing method thereof are provided. The manufacturing method includes first disposing a plurality of space transformers on a reinforcing plate and the space transformer includes several first pads. Then, the space transformer is fixed on the reinforcing plate. Thereafter, photoresist films having a plurality of openings is formed on the space transformer. The first pads are disposed in the openings. After that, a metal layer is formed and covered on the first pad. Later, the photoresist film is removed and the metal layer is planarized to form a second pad. Afterwards, the reinforcing plate is electrically connected with a PCB. Thereafter, a probe head having a plurality of probing area is provided and each probing area is corresponding to one of the space transformer. The probes in the probing area are electrically connected with the internal circuitry of the space transformer.

6 Claims, 12 Drawing Sheets

(56) References Cited

U.S. PATENT DOCUMENTS

| | | |
|---|---|---|
| 2009/0184727 A1* | 7/2009 | Kim et al. ................... 324/754 |
| 2009/0212801 A1* | 8/2009 | Ku et al. ...................... 324/754 |
| 2010/0052707 A1* | 3/2010 | Nakayama et al. ........... 324/754 |
| 2011/0050265 A1* | 3/2011 | Hobbs et al. ............. 324/756.03 |
| 2013/0069680 A1* | 3/2013 | Duckworth et al. ..... 324/754.03 |

FOREIGN PATENT DOCUMENTS

| | | |
|---|---|---|
| TW | 200943511 A | 3/2014 |
| WO | 2007/075070 A1 | 7/2007 |
| WO | 2008/114973 A1 | 9/2008 |
| WO | WO 2009025427 A1 * | 2/2009 |
| WO | 2011/004956 A1 | 1/2011 |

\* cited by examiner

US 9,234,917 B2

PROBING DEVICE AND MANUFACTURING METHOD THEREOF

FIELD OF THE INVENTION

The present invention relates to a probing device, and more particularly, to a probing device for semiconductor testing and manufacturing method thereof.

BACKGROUND OF THE INVENTION

Process of manufacturing semiconductor wafers to produce integrated circuit (IC) chips involves a number of steps, such as lithography, deposition and etching, etc. Due to complexity of the manufacturing process, some IC chips will inevitably possess defects. Therefore, the defective IC chips are tested before wafer dicing is performed to separate above mentioned IC chips from the semiconductor wafers, so as to determine whether the IC chips are defective.

Please refer to FIG. 1. FIG. 1 is a diagram illustrating a conventional probing device 10. The conventional probing device 10 comprises a cage 11, a printed circuit board (PCB) 12, a space transformer 14 and a probe head 16. The space transformer 14 is disposed on the PCB 12 via a plurality of solders 18, and the probe head 16 is fixed by the cage 11. Further, the probe head 16 comprises a plurality of probes 162. One end of the probe 162 is in contact with a pad 141 disposed on the space transformer 14, and the other end of the probe 162 is in contact with a chip (not illustrated) on the wafer being tested, so the chips (not illustrated) on the wafer can be tested via the probes 162. Circuitries (not illustrated) are disposed in the space transformer 14, so that the probes 162 on the probe head 16 can be electrically connected to the PCB 12 via these circuitries. In this way, testing signals received by the probes 162 can be transferred to the PCB 12 via the space transformer 14, for further follow-up analysis.

In the current market, the probing device 10 is produced and assembled by dedicated probing device manufacturers. The space transformer 14, however, is usually provided by IC manufacturers or IC design companies, due to cost issue. On the other hand, only one probe head 16 is disposed on the space transformer 14 shown in FIG. 1, so that only one single device under test (DUT) can be detected and tested at a time. To increase testing efficiency, some manufacturers may dispose a plurality of probing areas in one probe head for allowing each probing area to correspond to one single DUT, so that number of multiple DUTs can be detected at once. Such probing device can be referred to as a multi-DUT probing device, and the probing device similar to FIG. 1 can be referred to as a single DUT probing device.

Please refer to FIG. 2. FIG. 2 is a diagram illustrating another conventional multi-DUT probing device 20. The multi-DUT probing device 20 comprises a cage 21, a PCB 22, a space transformer 24, a reinforcing plate 25 and a probe head 26. The probe head 26 comprises a plurality of probing areas 27. As shown in FIG. 2, the reinforcing plate 25 is utilized to increase the overall mechanical strength of the multi-DUT probing device 20. Since the probe head 26 comprises a plurality of probing areas 27, where each probing area 27 corresponds to one DUT and comprises a plurality of probes 272, the multi-DUT probing device 20 can thus detect multiple number of DUTs at one time.

Although the multi-DUT probing device 20 can detect multiple number of DUTs at the same time, but due to the probe head 26 comprising a plurality of probing areas 27, the space transformer 24 is not interchangeable with the space transformer 14 of FIG. 1, as a result, redesign and remanufacturing are required. Consequently, the cost of the multi-DUT probing device is increased. Hence, allowing a multi-DUT probing device to continue to utilize the space transformer of a single-DUT probing device is an issue worth considering for those skilled in the art.

In Japan Patent Publication No. 2010266300, each space transformer is positioned using a reference base. After each space transformer is positioned the space transformer is then fixed onto a PCB. However, such positioning method is merely preliminary. When reflow soldering is performed later on, position of the space transformer may still be shifted away, thereby causing misalignment between probes of the probing areas and the pads on the space transformer.

SUMMARY OF THE INVENTION

A purpose of the present invention is to provide a probing device and manufacturing method thereof. The probing device can utilize the space transformer of a single-DUT probing device, and the cost of the probing device can be thereby lowered.

An embodiment of the present invention discloses a manufacturing method for a probing device. The manufacturing method comprises providing a reinforcing plate; disposing a plurality of space transformers on the reinforcing plate, wherein a surface of the transforming plate comprises a plurality of first pads; fixing the space transformer on the reinforcing plate, for configuring the internal circuitry of the space transformer to be electrically connected to the internal circuitry of the reinforcing plate; forming a photoresist film on the space transformer, wherein the photoresist film comprises a plurality of openings and the first pad is disposed in the opening; forming a metal layer in each of the plurality of openings, wherein the metal layer covers the plurality of first pad for forming a plurality of second pads; removing the photoresist film; providing a printed circuit board (PCB) and electrically connecting the internal circuitry of the reinforcing plate to internal circuitry of the PCB; and providing a probe head, the probe head comprising a plurality of probing areas, each probing area corresponding to one of the plurality of space transformers, each probing area comprising a plurality of probes, wherein the plurality of probes are electrically connected to the internal circuitry of the space transformer via the plurality of second pads.

Another embodiment of the present invention discloses a probing device. The probing device comprises a printed circuit board (PCB), a reinforcing plate, a plurality of space transformers and a probe head. The reinforcing plate is disposed on the PCB and internal circuitry of the reinforcing plate is electrically connected to the internal circuitry of the PCB. The plurality of space transformers are disposed on the reinforcing plate, wherein a plurality of first pads and a plurality of second pads are disposed on each space transformer, the second pad covers the first pad, and the upper surfaces of the plurality of second pads form a flat plane. The probe head comprises a plurality of probing areas, wherein the probing area comprises a plurality of probes, and the probes are electrically connected to internal circuitry of the space transformer via the second pads. A center line of at least one second pad does not overlap a center line of the first pad being covered below.

These and other objectives of the present invention will no doubt become obvious to those of ordinary skill in the art after reading the following detailed description of the preferred embodiment that is illustrated in the various figures and drawings.

DETAILED DESCRIPTION OF THE INVENTION

Figure 3:
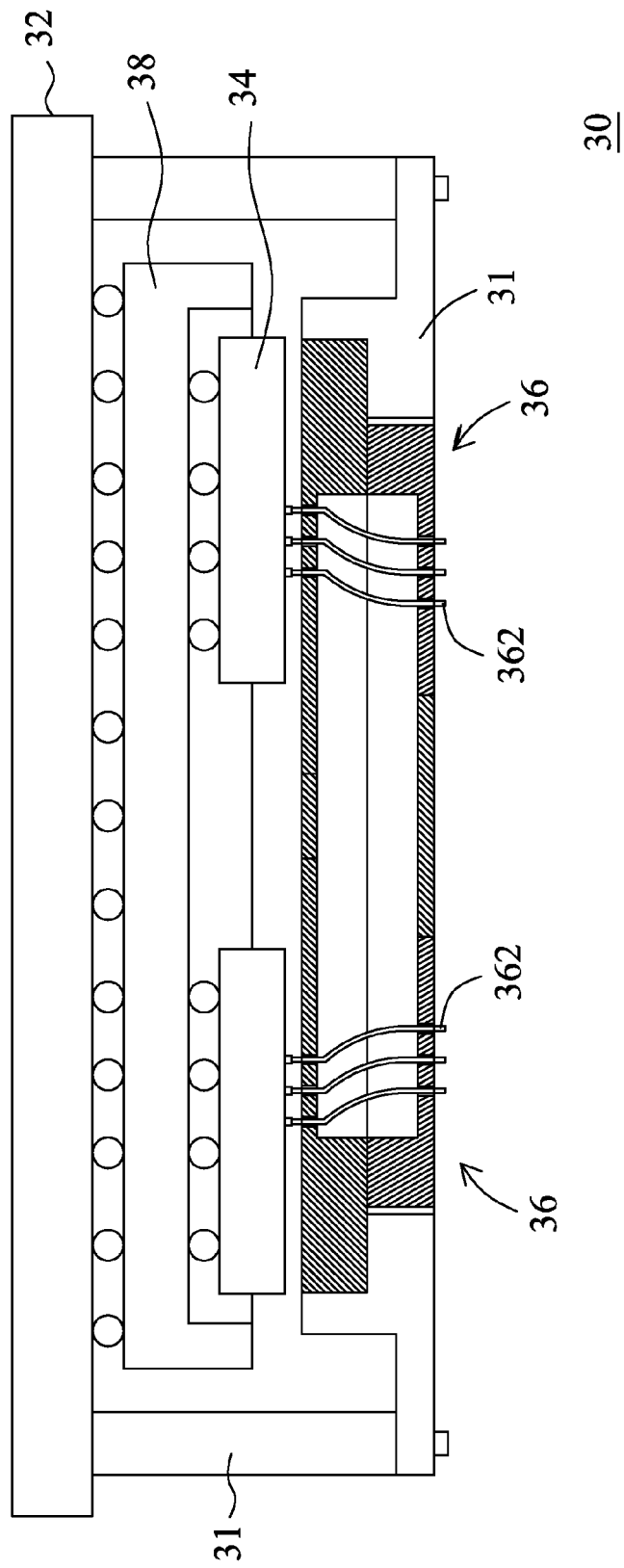
FIG. 3 is a diagram illustrating a probing device according to a first embodiment of the present invention.

Please refer to FIG. 3. FIG. 3 is a diagram illustrating a probing device according to a first embodiment of the present invention. The probing device 30 comprises a cage 31, a printed circuit board (PCB) 32, a reinforcing plate 38, a plurality of space transformers 34 and a probe head 35. The probe head 35 comprises a plurality of probing areas 36. The reinforcing plate 38 is disposed in one side of the PCB 32 and is electrically connected to the PCB 32. A structure of the reinforcing plate 38 can be, for instance, Multi-Layered Ceramic (MLC), which processes relatively high hardness, for increasing the overall strength of the probing device 30. Furthermore, the space transformers 34 are electrically connected to the reinforcing plate 38, meaning that the internal circuitries of the space transformer 34 and the reinforcing plate 38 are electrically connected. Structures of the plurality of space transformers 34 can be Multi-Layered Organic (MLO), for instance.

Each probing area 36 comprises a plurality of probes 362, and the probe head 35 is fixed by the cage 31. One end of the probe 362 is electrically contacted with the space transformer 34, and the other end of the probe 362 is in contact with a DUT (not illustrated). As shown in FIG. 3, a space between two neighboring probing areas 36 is formed for jumping DUTs. The meaning of the phrase "Jumping DUTs" as described herein is that the probe arrangement of the multi-DUT probing device 30 shows regionalized distribution, so that during testing, the probing device can go across at least one DUT, and test other DUTs located on both sides which are next to the DUT that had being went across. For instance, when the probing device 30 touches a wafer, the probing device 30 does not simultaneously touch two neighboring chips, instead, the probing device 30 tests the chips that are located on both sides across a certain chip (or chips).

Figure 4A:
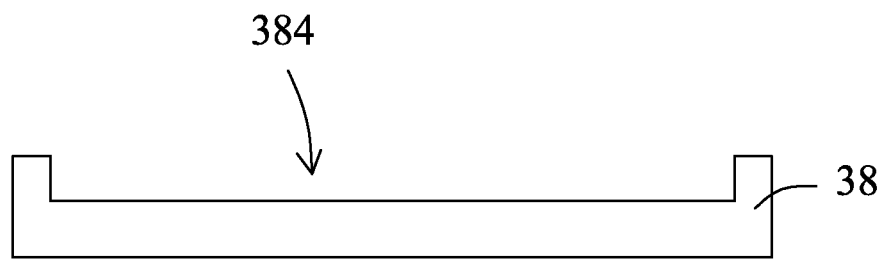
FIG. 4A~FIG. 4I are a plurality of sectional view diagrams illustrating a manufacturing process of the probing device of the first embodiment of the present invention.
Figure 4B:
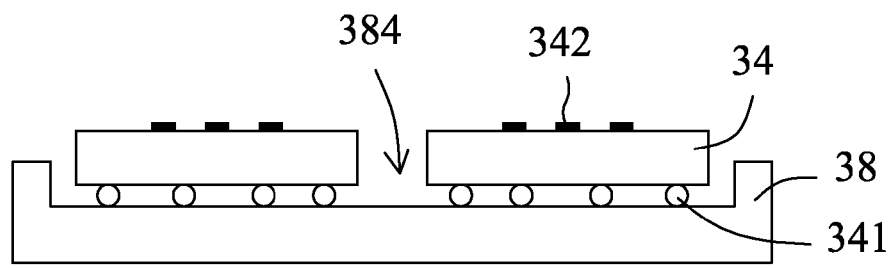

Please refer to FIG. 4A~FIG. 4I. FIG. 4A~FIG. 4I are a plurality of sectional view diagrams illustrating a manufacturing process of the probing device 30 of the first embodiment of the present invention. Firstly please refer to FIG. 4A, where a reinforcing plate 38 is provided. One side of the reinforcing plate 38 comprises a cavity 384. Secondly please refer to FIG. 4B and FIG. 5A. FIG. 5A is a top view diagram illustrating the probing device of FIG. 4B. A plurality of space transformers 34 are disposed in the cavity 384 of the reinforcing plate 38, as shown in FIG. 5A. A plurality of positioning points 382 are disposed on the bottom of the cavity 384. During positioning of the space transformer 34, the corners of the space transformer 34 are leaned against the positioning points 382, so as to utilize the positioning points 382 to position the space transformer 34.

Figure 4C:
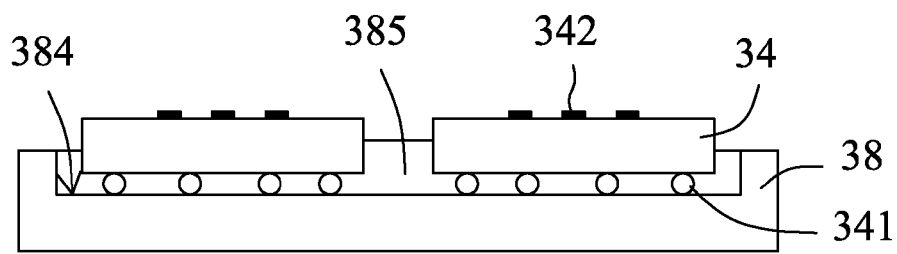
Figure 5A:
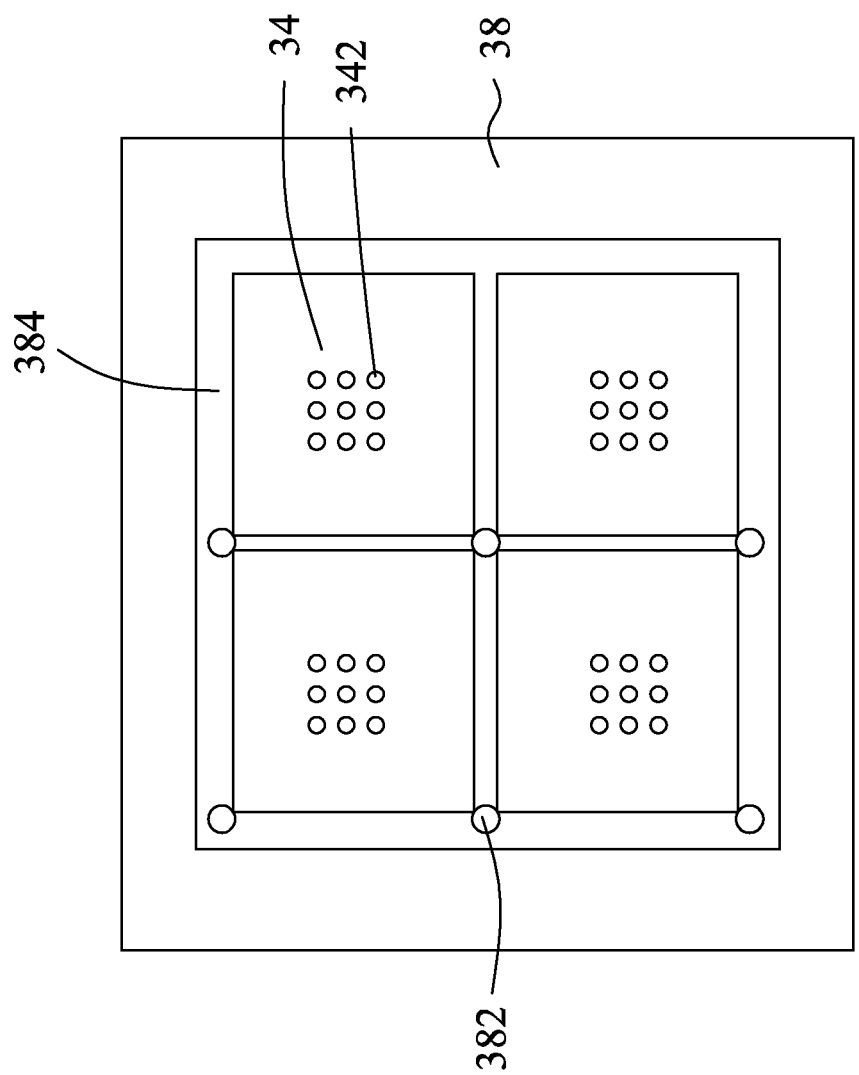
FIG. 5A is a top view diagram illustrating the probing device of FIG. 4B

Please refer to FIG. 4C. When the space transformer 34 is positioned, reflow process is performed for soldering the solders 341 under the space transformer 34 onto the reinforcing plate 38. On the other hand, a plurality of first pads 342 are disposed on the space transformer 34. The plurality of first pads 342 can be made of copper, for instance. The cavity 384 is then filled with an underfill 385, for preventing the solders 341 from being polluted by external environment.

Figure 5B:
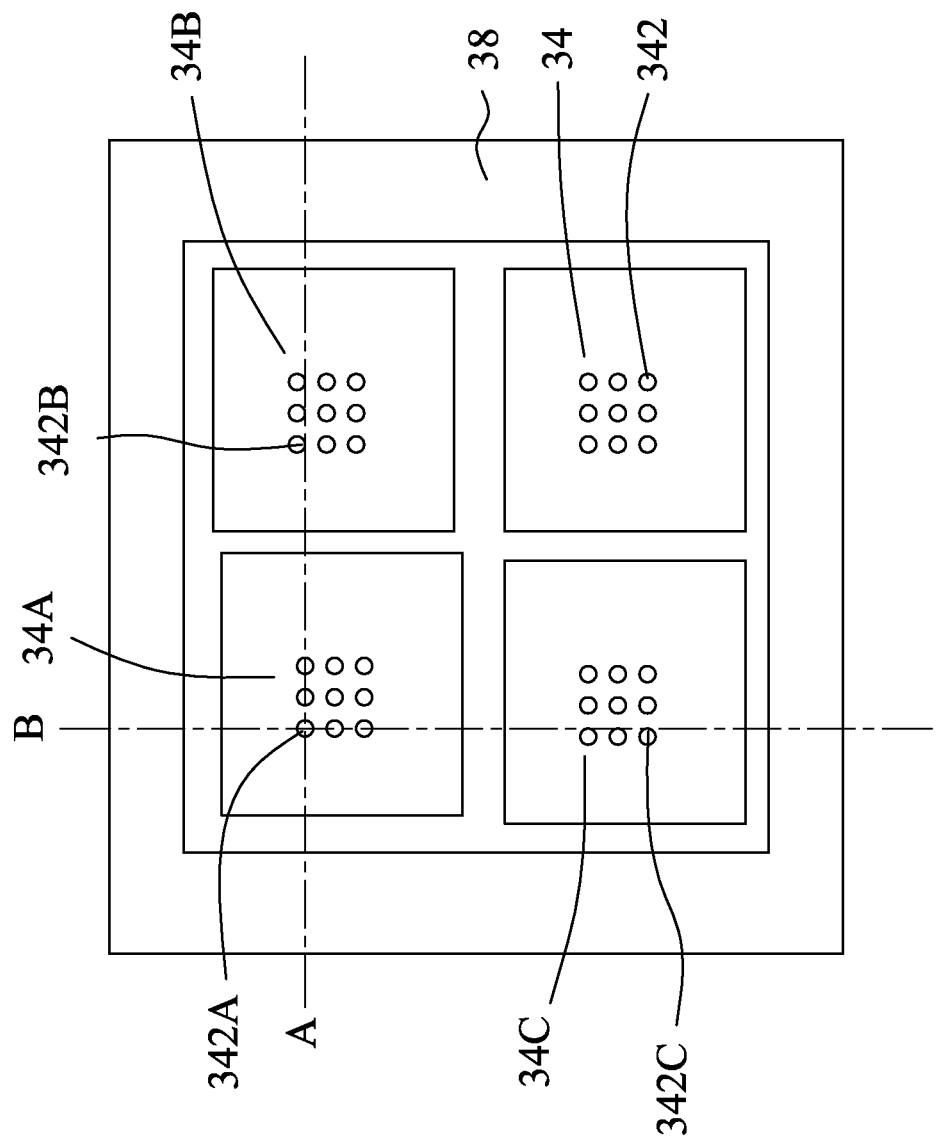
FIG. 5B is a top view diagram illustrating the probing device of FIG. 4C

Please refer to FIG. 5B. FIG. 5B is a top view diagram illustrating the probing device of FIG. 4C. As shown in FIG. 5B, the first pads 342 on each space transformer 34 is not aligned to the first pads 342 of the respective corresponding positions on other neighboring space transformers 34. The respective centers of the first pads 342 on each space transformer 34 are aligned to one horizontal extension line or one vertical extension line. In other words, the center of a first pad 342A on the space transformer 34A and the center of a first pad 342B of a corresponding position on the space transformer 34B are not aligned to the same extension line A. Similarly, the center of the first pad 342A on the space transformer 34A and the center of a first pad 342C of a corresponding position on the space transformer 34C are not aligned to the same extension line B. Please note that interpretation of "corresponding positions" mentioned above should be clear to those skilled in the art. For instance, if the first pad 342A is at a left front position on the space transformer 34A, the first pad 342B and the first pad 342C are also at a corresponding left front position on the space transformer 34B and the space transformer 34C, respectively.

One of the reasons for the above phenomenon is that: after the space transformer 34 is preliminarily positioned on the reinforcing plate 38, reflow process is required for soldering the space transformer 34 onto the reinforcing plate 38. However, the space transformer 34 may shift away during the reflow process. Also, after reflow is performed, the thickness of the solders 341 under the space transformer 34 may change, thereby causing the height of the first pads 342 on different space transformers 34 to be inconsistent.

Figure 4D:
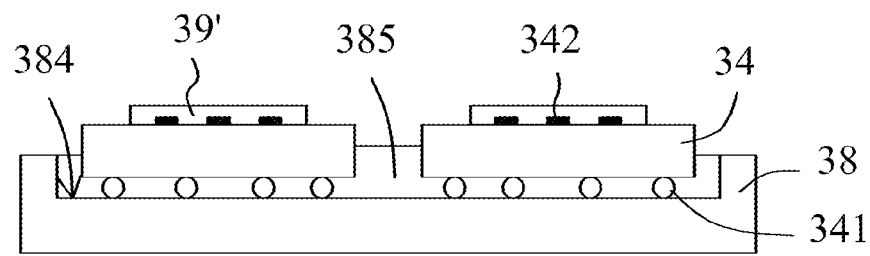

Subsequently, please refer to FIG. 4D. As shown in FIG. 4D, a photoresist layer 39' is painted on each space transformer 34. The photoresist layer 39' covers the first pads 342. Please refer to FIG. 4E, the photoresist layer 39' is shown to have gone through lithography to form a photoresist film 39. The photoresist film 39 comprises a plurality of openings 391, where the first pad 342 is disposed in the opening 391.

Please refer to 4F. A metal layer (material of second layer 344) is deposited in the opening 391 via electroplating; and the metal layer covers the first pad 342. After the metal layer has completely deposited, a second pad 344 is formed. The first pad 342 is covered by the second pad 344. In the present embodiment, the material of the metal layer is the same as that of the first pad 342, which mainly includes copper. Material of the metal layer is not limited to copper and can be other substances with excellent conductivity.

Figure 4E:
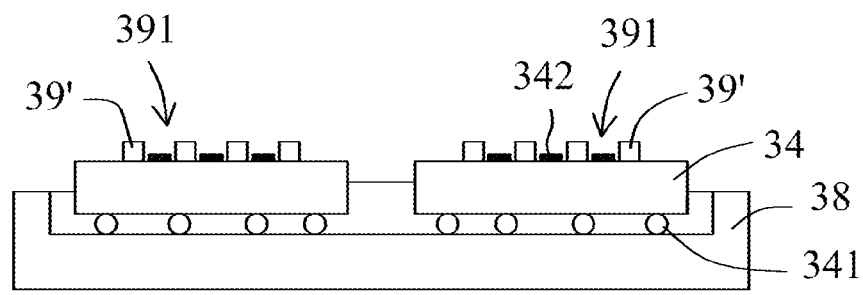
Figure 4F:
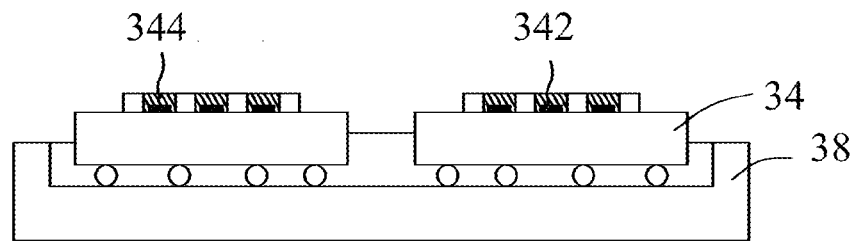

In FIG. 4E, the first pad 342 is completely inside the opening 391. In other embodiments, however, the photoresist film 39 can cover a portion of the first pad 342, so that only a part of the first pad 342 is inside opening 391. Hence, the second pad 344 that is formed will only cover the part of the first pad 342 below, which is not covered by the photoresist film 39.

Subsequently, planarization process is then performed, for planarizing the upper surfaces of the second pads 344. Via planarization, not only the upper surfaces of the second pads 344 can be planarized, upper surface of each second pad 344 can also be ensured to be aligned to the same plane. As a result, the issue of height difference found between the first pads 342 on different space transformers 34 can be compensated.

Figure 4G:
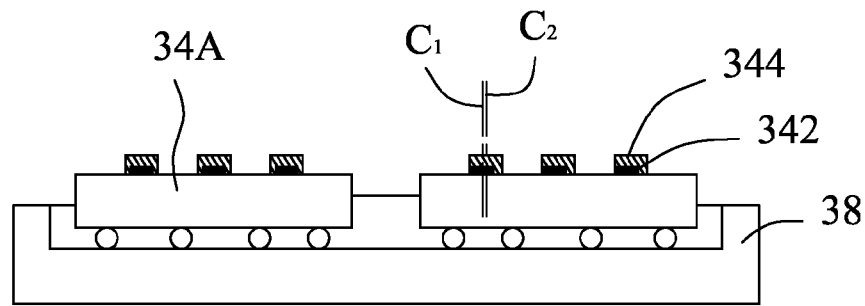

Please refer to FIG. 4G, where the photoresist film 39 (as shown in FIG. 4E) is removed, leaving only the second pads 344 to remain. As shown in FIG. 4G, apart from the space transformer 34A, a center line C2 of at least one second pad 344 on another space transformer 34 does not overlap with a center line C1 of the corresponding first pad 342 being covered below.

Figure 5C:
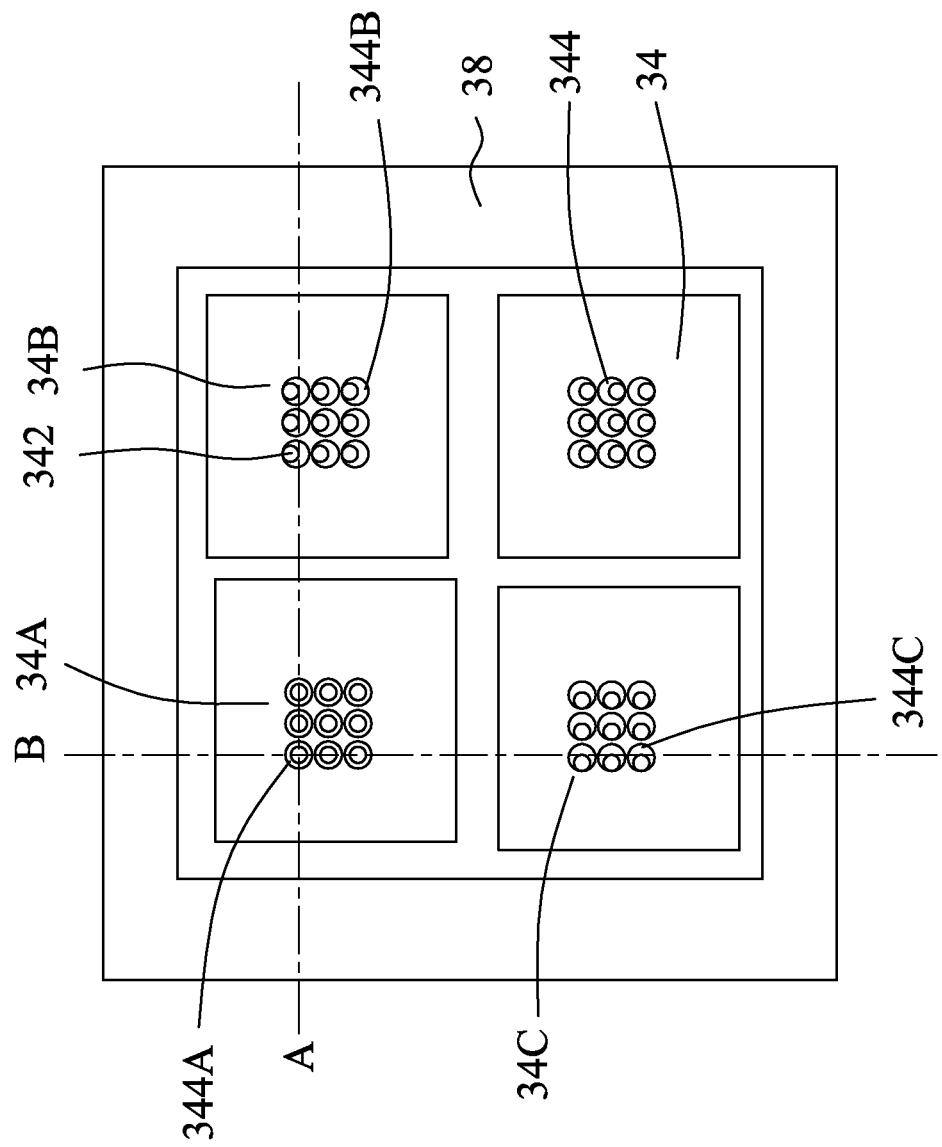
FIG. 5C is a top view diagram illustrating the probing device of FIG. 4G
Figure 6A:
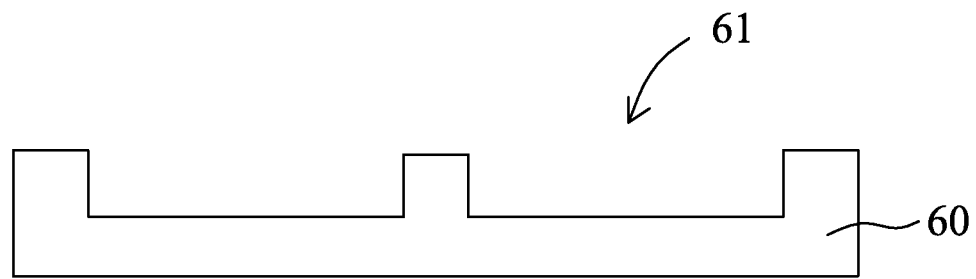
FIG. 6A~FIG. 6D are a plurality of diagrams illustrating the configuration and positioning of the space transformer according to another embodiment of the present invention.
Figure 6B:
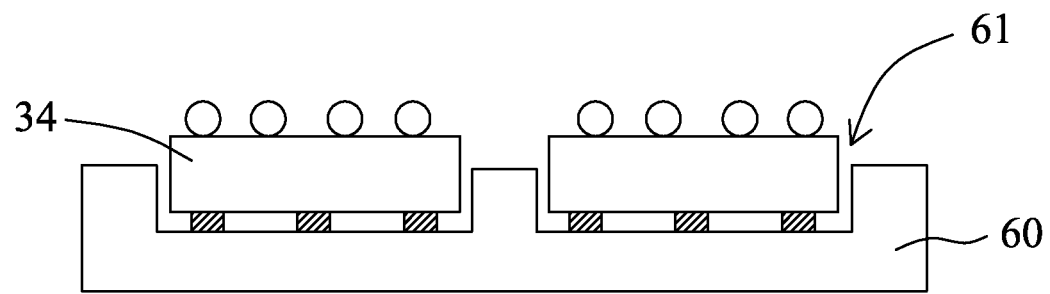
Figure 6C:
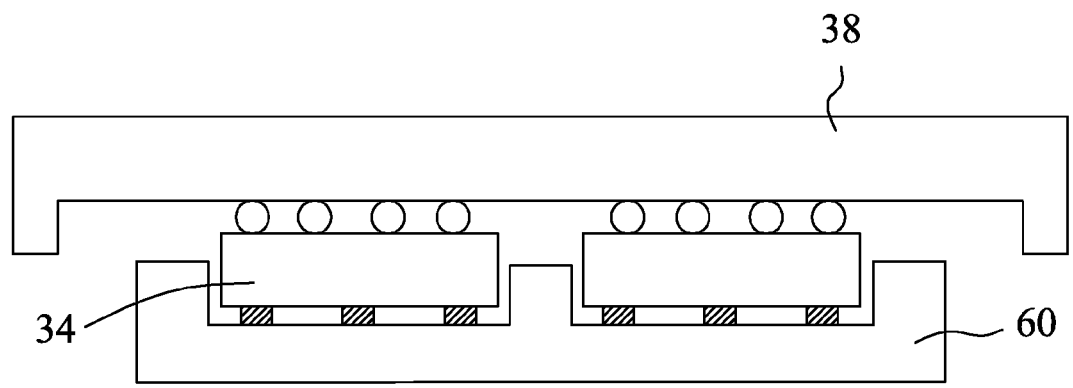
Figure 6D:
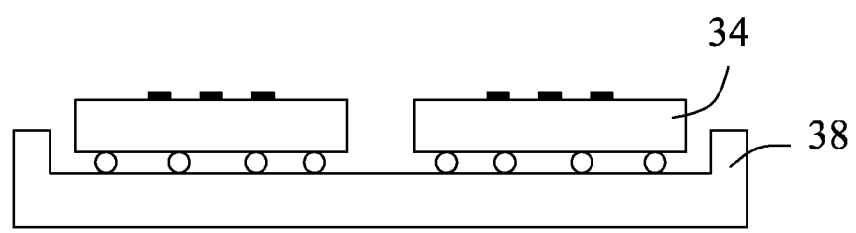

Please refer to FIG. 5C. FIG. 5C is a top view diagram illustrating the probing device of FIG. 4G In the present embodiment, the center of the second pad 344 on each space transformer 34 and the center of the second pad 344 of a corresponding position on another neighboring space transformers 34 are aligned to one horizontal extension line or one vertical extension line. In other words, the center of the second pad 344A on the space transformer 34A and the center of the second pad 344B of a corresponding position on the space transformer 34B are aligned to the same extension line A. Similarly, the center of the second pad 344A on the space transformer 34A and the center of the second pad 344C on the space transformer 34C are aligned to the same extension line B.

Figure 4H:
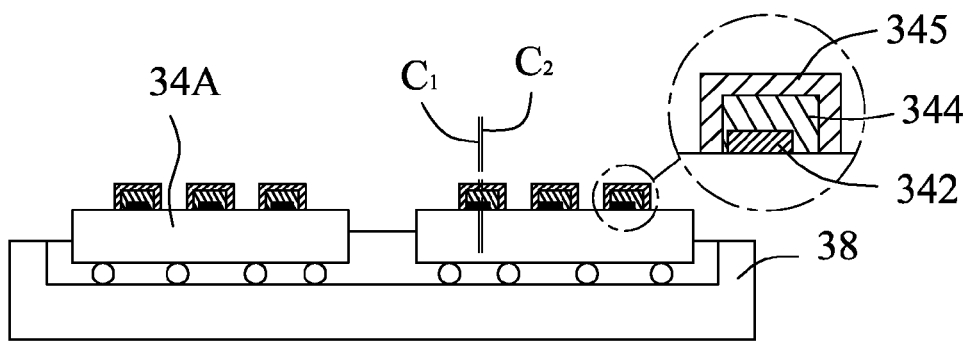

Please refer to FIG. 4H. After the second pads 344 are produced, an anti-oxidation layer 345 can be formed on a surface of the second pads 344. Afterwards, please refer to FIG. 4I, where the reinforcing plate 38 is soldered on one PCB 32. Internal circuitry of the reinforcing plate 38 is electrically connected to the internal circuitry of the PCB 32 via the plurality of solders 381. The probe head can then be assembled on the space transformer 34, completing the assembly of the probing device 30 (as shown in FIG. 3).

Please compare FIG. 5B and FIG. 5C. In FIG. 5B, since the space transformer 34 will shift away during reflow process, the first pads 342 on different space transformer 34 are not aligned to each other. Hence, some probes 362 of the probing area 36 will not be able to align to the first pads 342. Furthermore, since the probes 362 of the probing area 36 must contact the pads (not illustrated) on the DUT, the user cannot adjust positions of the probes 362 during assembling of the probing device for allowing the probes 362 to contact the first pads 342 whose positions are shifted away. Consequently, the assembled probing device cannot function properly. This is also the reasons as to why the space transformer (e.g. the space transformer 14 in FIG. 1) of a single-DUT probing device cannot be applied to a multi-DUT probing device.

On the other hand, as shown in FIG. 5C, since the area of the second pad 344 is larger than that of the first pad 342, the probes 362 of the probing area 36 can still effectively come in contact with the second pads 344 by utilizing the first pads 342, even though the first pads 342 are shifted away after reflow. In this way, the assembled probing device 30 can function properly. In other words, the area of the second pad 344 has to be large enough for achieving effective contact with the probe 362 of the probing area 36, so that signals can be transmitted between the second pad 344 and the probe 362. Area of the second pad 344 is not specifically limited, as long as the probes 362 can be electrically connected to the internal circuitry of the space transformer 34 via the second pads 344.

Figure 1:
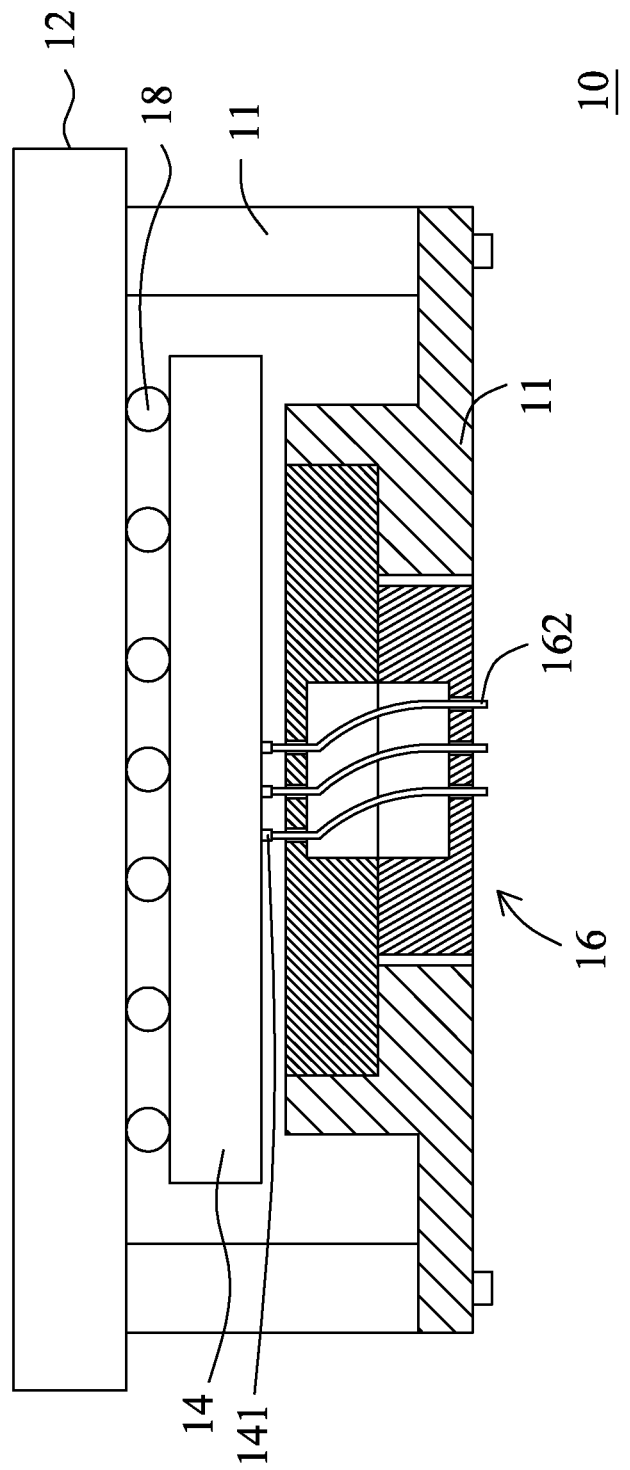
FIG. 1 is a diagram illustrating a conventional probing device.
Figure 2:
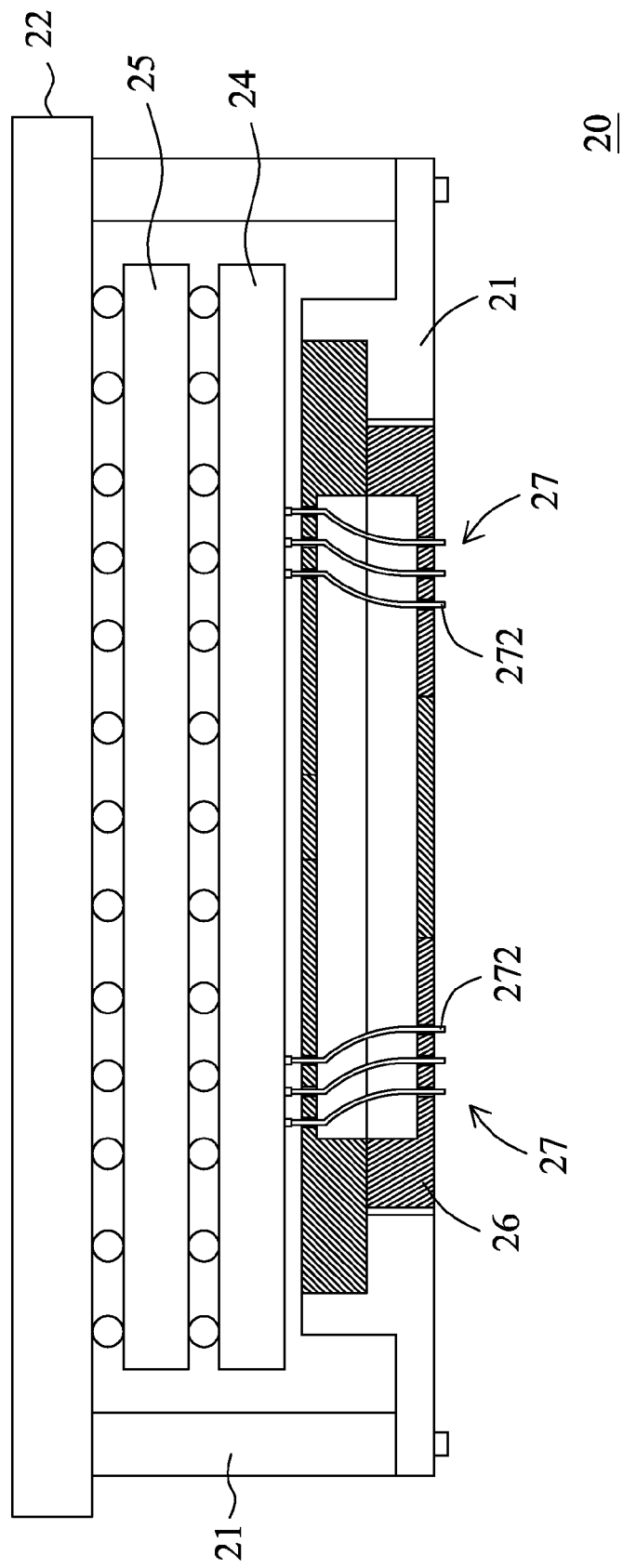
FIG. 2 is a diagram illustrating another conventional multi-DUT probing device.

In the present embodiment, the structure of the space transformer 34 is similar to that of the space transformer 14 shown in FIG. 1. In other words, the space transformer 34 can be originally designed for the single-DUT probing device (e.g. the probing device 10 in FIG. 1). However, the space transformer 34 can be applied to multi-DUT probing device (e.g. the probing device 30 in FIG. 3) via the manufacturing process as shown in FIG. 4A~FIG. 4I. This way, when manufacturing multi-DUT probing devices, new space transformers are not required, and the space transformer for the single-DUT probing device can still be utilized. Therefore, effect of economic of scales can be achieved, further lowering cost of the probing device 30.

Figure 4I:
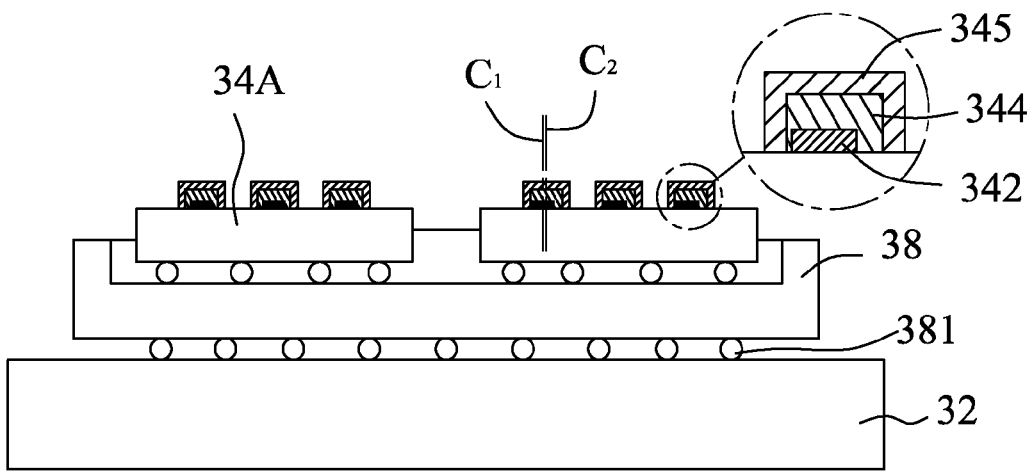

A purpose of the anti-oxidation layer 345 shown in FIG. 4I is to protect the second pads 344, for preventing the second pads from oxidation. However, those skilled in the art can choose not to implement the anti-oxidation layer 345 according to practical needs.

In the above embodiments, the second pads 344 on different space transformer 34 are aligned. However, the second pads 344 on different space transformer 34 are not required to be aligned precisely, as long as the probes 362 of the probing area 36 can be electrically connected to the internal circuitry of the corresponding space transformer via the second pads 344. In other words, transmittance of test signals is ensured between the probes 362 and the second pads 344.

For the above embodiments, a number of space transformers 34 disposed on the reinforcing plate 38 is four, but is not limited to this. For instance, the number of space transformers 34 being disposed on the reinforcing plate can be adjusted (e.g. two or six, etc.) according to practical needs.

In FIG. 4B, the space transformer 34 is positioned via the positioning points 382, but is not limited to such manner. Please refer to FIG. 6A~FIG. 6D. FIG. 6A~FIG. 6D are sectional view diagrams illustrating a method of the positioning of the space transformer according to another embodiment of the present invention. Please refer to FIG. 6A, where a cage 60 is provided. A plurality of positioning cavities 61 is disposed on the cage 60. Please then refer to FIG. 6B, where a space transformer 34 is disposed in each of the positioning cavity 61. Please refer to FIG. 6C, where a reinforcing plate 38 is then arranged to be close to the cage 60 and reflow process is performed for soldering the space transformer 34 to the reinforcing plate 38. Please refer to FIG. 6D, where the reinforcing plate 38 is then separated from the cage 60, thereby completing the positioning of the space transformer 34.

Figure 7:
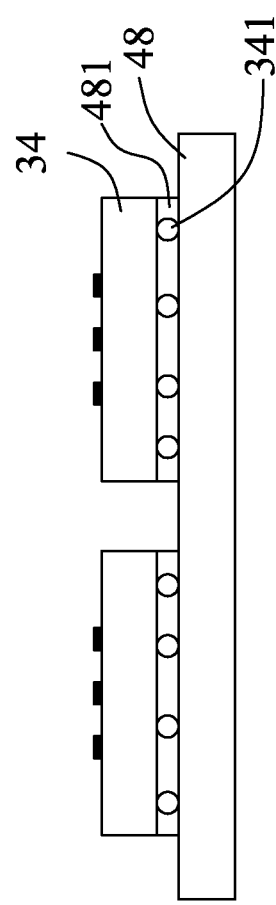
FIG. 7 is a sectional view diagram illustrating a reinforcing plate according to another embodiment of the present invention.

In the above embodiments, cavities 384 are disposed on the reinforcing plate 38 and the space transformer 34 is disposed in the cavities 384. However, the reinforcing plate can also be implemented without the cavities, according to practical needs. Please refer to FIG. 7. FIG. 7 is a diagram illustrating a reinforcing plate 48 according to another embodiment of the present invention. In the present embodiment, upper surface of the reinforcing plate 48 is a flat plane without any cavities and the space transformer 34 is disposed directly on the upper surface of the reinforcing plate 48. Furthermore, for avoiding solders 341 below the space transformer 34 from being contaminated by the environment, underfill 481 can be filled between the space transformer 34 and the reinforcing plate 38.

Those skilled in the art will readily observe that numerous modifications and alterations of the device and method may be made while retaining the teachings of the invention. Accordingly, the above disclosure should be construed as limited only by the meters and bounds of the appended claims.

What is claimed is:

1. A probing device, comprising:

a printed circuit board;

a reinforcing plate, wherein the reinforcing plate is disposed on the printed circuit board and the internal circuitry of the reinforcing plate is electrically connected to internal circuitry of the printed circuit hoard;

a plurality of space transformers, disposed on the reinforcing plate, wherein a plurality of first pads and a plurality of second pads are disposed on each space transformer, at least a portion of the second pad covers and directly contacts the first pad, and a plurality of upper surfaces of the plurality of second pads form a flat plane; and a probe head, comprising a plurality of probing areas, wherein the probing area comprises a plurality of probes and the plurality of probes are electrically connected to the internal circuitry of the space transformer via the second pads;

wherein a center line of at least one second pad does not overlap a center line of the first pad being covered below the second pad.

2. The probing device of claim 1, wherein a center of the second pad on each space transformer and a center of the second pad of a corresponding position on a neighboring space transformer are aligned to one horizontal extension line or one vertical extension line.

3. The probing device of claim 1, wherein the plurality of space transformers are disposed on the reinforcing plate, an underfill is filled between each space transformer and the reinforcing plate.

4. The probing device of claim 1, wherein the material of the second pad is same as the material of the first pad.

5. The probing device of claim 1, wherein a material of the reinforcing plate is ceramic and a material of the space transformer is organic.

6. The probing device of claim 1, wherein an anti-oxidation layer is formed on surface of the second pad.

* * * * *